United States Patent
Sato

(10) Patent No.: US 11,309,456 B2
(45) Date of Patent: Apr. 19, 2022

(54) NITRIDE SEMICONDUCTOR LIGHT EMITTING DEVICE, ULTRAVIOLET LIGHT EMITTING MODULE

(71) Applicant: ASAHI KASEI KABUSHIKI KAISHA, Tokyo (JP)

(72) Inventor: Kosuke Sato, Tokyo (JP)

(73) Assignee: Asahi Kasel Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/010,319

(22) Filed: Sep. 2, 2020

(65) Prior Publication Data

US 2020/0403122 A1 Dec. 24, 2020

Related U.S. Application Data

(62) Division of application No. 16/044,771, filed on Jul. 25, 2018, now Pat. No. 10,847,679.

(51) Int. Cl.
*H01L 33/00* (2010.01)
*H01L 33/32* (2010.01)
(Continued)

(52) U.S. Cl.
CPC ............ *H01L 33/325* (2013.01); *H01L 33/20* (2013.01); *H01L 33/38* (2013.01); *H01L 33/32* (2013.01)

(58) Field of Classification Search
CPC ....... H01L 33/02; H01L 33/26; H01L 33/325; H01L 33/36; H01L 33/38; H01L 33/382; H01L 33/385; H01L 33/20; H01L 33/32; H01L 31/0352; H01L 31/03044; H01L 31/03048; H01L 31/035281;
(Continued)

(56) References Cited

U.S. PATENT DOCUMENTS 6,344,665 B1 * 2/2002 Sung ........................ H01L 33/38
257/459
8,779,441 B2 7/2014 Okabe
(Continued)

FOREIGN PATENT DOCUMENTS

CN 105977354 A 9/2016
JP 2004014973 A 1/2004
(Continued)

*Primary Examiner* — Natalia A Gondarenko
(74) *Attorney, Agent, or Firm* — Morgan, Lewis & Bockius LLP

(57) ABSTRACT

This invention provides a nitride semiconductor light emitting device in which current concentration is suppressed without excessively increasing resistance at a low cost without increasing a manufacturing process.
The planar shape of a mesa portion configuring a nitride semiconductor light emitting device is a shape containing a convex-shaped tip portion 352b formed by a curved line or a plurality of straight lines and abase portion 352a continuous to the convex-shaped tip portion 352b, in which an obtuse angle is formed by adjacent two straight lines in the convex-shaped tip portion formed by the plurality of straight lines. The first electrode layer 4 has visible outlines 411 and 412 along a visible outline 302 of the mesa portion through a gap 9 in planar view. The relationship between a gap W1 in the convex-shaped tip portion 352b and a gap W2 in the base portion 352a is W1>W2.

5 Claims, 12 Drawing Sheets

(51) Int. Cl.
*H01L 33/20* (2010.01)
*H01L 33/38* (2010.01)

(58) Field of Classification Search
CPC ... H01L 33/0075; H01L 33/08; H01L 33/105; H01L 33/18; H01L 33/11; H01L 33/14; H01L 33/504; H01L 33/50; H01L 33/60; H01L 33/62; H01L 33/486; H01L 33/387; H01L 27/14; H01L 27/142; H01L 27/1446; H01L 27/14605; H01L 27/14607; H01L 27/1463; H01L 27/14643; H01L 27/14678; H01L 27/15; H01L 31/0236; H01L 31/02363; H01L 31/065; H01L 31/0682; H01L 31/153; H01L 31/173; H01L 31/1804
USPC .... 257/79, 88, 89, 91, 95, 98, 99, 100, 102, 257/117, 118, 457, 459
See application file for complete search history.

(56) References Cited

U.S. PATENT DOCUMENTS

| | | |
|---|---|---|
| 9,812,611 B2 | 11/2017 | Hirano et al. |
| 10,326,053 B2 | 6/2019 | Obata |
| 2004/0061123 A1 | 4/2004 | Shelton et al. |
| 2006/0138445 A1 | 6/2006 | Zhao et al. |
| 2007/0102715 A1 | 5/2007 | Ko et al. |
| 2007/0254394 A1 | 11/2007 | Seo et al. |
| 2009/0140280 A1 | 6/2009 | Ku et al. |
| 2016/0141454 A1 | 5/2016 | Chuang et al. |
| 2016/0197237 A1 | 7/2016 | Chen et al. |
| 2016/0268477 A1 | 9/2016 | Fujita et al. |
| 2017/0263674 A1* | 9/2017 | Yang ................... H01L 27/153 |
| 2017/0263817 A1 | 9/2017 | Hirano et al. |
| 2017/0309781 A1 | 10/2017 | Moe et al. |
| 2018/0040770 A1 | 2/2018 | Obata et al. |
| 2018/0358511 A1 | 12/2018 | Obata |
| 2019/0198714 A1 | 6/2019 | Sato |

FOREIGN PATENT DOCUMENTS

| | | |
|---|---|---|
| JP | 20040128321 | 4/2004 |
| JP | 2006019764 A | 1/2006 |
| JP | 2014-096460 A | 5/2014 |
| JP | 5985782 B1 | 9/2016 |
| JP | 2017028032 A | 2/2017 |
| JP | 2017108117 A | 6/2017 |
| TW | 201707237 A | 2/2017 |
| TW | 201711229 A | 3/2017 |
| WO | 2016/143574 A1 | 9/2016 |
| WO | 2016157518 A1 | 10/2016 |

* cited by examiner

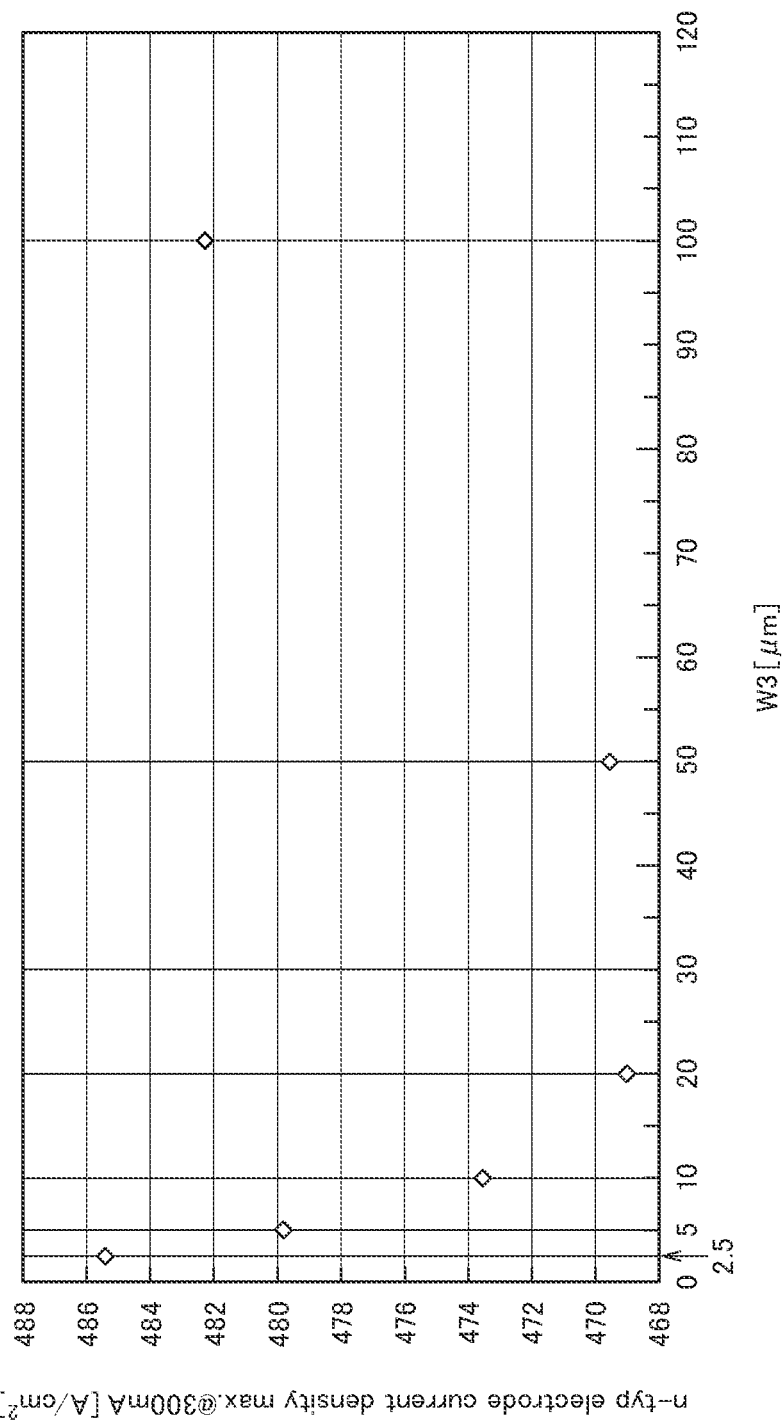
F I G. 13

NITRIDE SEMICONDUCTOR LIGHT EMITTING DEVICE, ULTRAVIOLET LIGHT EMITTING MODULE

RELATED APPLICATION DATA

This application is a division of and claims the benefit of and priority to U.S. Ser. No. 16/044,771, filed Jul. 25, 2018, which claims the benefit of and priority to Japanese Application No. 2017-144673, filed Jul. 26, 2017. The entire disclosure of each of these applications is hereby incorporated herein by reference.

BACKGROUND OF THE INVENTION

Field of the Invention

The present invention relates to a nitride semiconductor light emitting device.

Description of the Related Art

A nitride semiconductor light emitting device contains, for example, a substrate, an n-type nitride semiconductor layer formed on the substrate, a mesa portion (portion containing an n-type nitride semiconductor layer, a nitride semiconductor light emitting layer, and a p-type nitride semiconductor layer of a nitride semiconductor laminate) formed in one part on the n-type nitride semiconductor layer, an n-type electrode formed on the n-type nitride semiconductor layer except the one part, and a p-type electrode formed on the p-type nitride semiconductor layer. The nitride semiconductor light emitting device has been demanded to uniformize a current flowing between the p-type electrode and the n-type electrode. This is because, when a current partially concentrates, a destruction of the element is caused, and thus the life time becomes shorter.

PTL1 has proposed a nitride semiconductor light emitting device capable of suppressing the current concentration without reducing the light emission area. Specifically, the planar shape of the p-type electrode is formed into a shape in which substantially the entire surface of the p-type semiconductor layer is covered and a high resistance layer having resistance higher than that of the p-type semiconductor layer or the p-type electrode is provided on a side close to the n-type electrode on the p-type semiconductor layer in planar view. The high resistance layer has a visible outline along a visible outline on the p-type semiconductor layer side of the n-type electrode through a gap in planar view.

PTL 2 has proposed suppressing current concentration by providing a p-type electrode limitation region (region where the formation ratio of the p-type electrode is smaller than that of the other regions of the mesa portion) near an end portion of a mesa structure while setting the distance between a one part of a mesa end and the outer periphery of the p-type electrode as viewed from a top view of a nitride semiconductor light emitting device to a predetermined value or more.

CITATION LIST

Patent Literatures

PTL 1: JP 2014-96460 A
PTL 2: WO 2016/143574

SUMMARY OF THE INVENTION

The nitride semiconductor light emitting device described in PTL 1 has problems that a manufacturing process increases for the formation of the high resistance layer and the manufacturing cost increases.

The nitride semiconductor light emitting device described in PTL 2 has posed a problem that the resistance excessively increases because the area of the p-type electrode having high contact resistance is relatively narrowed.

It is an object of the present invention to provide a nitride semiconductor light emitting device in which current concentration is suppressed without excessively increasing resistance at a low cost without increasing a manufacturing process.

In order to achieve the object described above, a nitride semiconductor light emitting device of a first aspect of the present invention has the following constituent requirements (a) and (b).

(a) A substrate, a nitride semiconductor laminate, a first electrode layer, and a second electrode layer are contained. The nitride semiconductor laminate contains a first nitride semiconductor layer having a first conductivity type formed on the substrate, a nitride semiconductor light emitting layer formed on the first nitride semiconductor layer, and a second conductivity type second nitride semiconductor layer formed on the nitride semiconductor light emitting layer. The nitride semiconductor and the second nitride semiconductor layer are formed in one part on the first nitride semiconductor layer to configure a mesa portion. The first electrode layer is formed on the first nitride semiconductor layer except the one part. The second electrode layer is formed on the second nitride semiconductor layer of the mesa portion.

(b) The planar shape of the mesa portion is a shape containing a convex-shaped tip portion formed by a curved line or a plurality of straight lines and a base portion continuous to the convex-shaped tip portion. In the convex-shaped tip portion formed by the plurality of straight lines, an obtuse angle is formed by adjacent two straight lines. The first electrode layer has a visible outline along a visible outline of the mesa portion through a gap in planar view. The relationship between W1 defined as an interval of the gap in the convex-shaped tip portion and W2 defined as an interval of the gap in the base portion is W1>W2.

A nitride semiconductor light emitting device of a second aspect of the present invention has the constituent requirement (a) described above and the following constituent requirement (c).

(c) The planar shape of the first electrode layer is a shape containing a convex-shaped tip portion formed by a curved line or a plurality of straight lines and a base portion continuous to the convex-shaped tip portion. In the convex-shaped tip portion formed by the plurality of straight lines, an obtuse angle is formed by adjacent two straight lines. The mesa portion has a visible outline along a visible outline of the first electrode layer through a gap in planar view. The relationship between W3 defined as an interval of the gap in the convex-shaped tip portion and W4 defined as an interval of the gap in the base portion is W3>W4.

A nitride semiconductor light emitting device of a third aspect of the present invention has the constituent requirement (a) described above and the following constituent requirement (d).

(d) The planar shape of the mesa portion is a shape containing a convex-shaped tip portion formed by a curved line or a plurality of straight lines and a base portion continuous to the convex-shaped tip portion. In the convex-shaped tip portion formed by the plurality of straight lines, an obtuse angle is formed by adjacent two straight lines. An angle θ (≤90°) defined by a cross angle between the side surface of the mesa portion facing the first electrode layer and the surface parallel to the surface of the substrate on which the first nitride semiconductor layer is formed is smaller in the convex-shaped tip portion than in the base portion.

The nitride semiconductor light emitting device of the present invention is a nitride semiconductor light emitting device in which current concentration is suppressed without excessively increasing the resistance and which can be provided at a low cost without increasing a manufacturing process.

BRIEF DESCRIPTION OF THE DRAWINGS

FIG. 13 is a graph illustrating the relationship between W3 and the maximum current density in the case of W4=5 μm created from simulation results.

DESCRIPTION OF THE PREFERRED EMBODIMENTS

Hereinafter, an embodiment of the present invention is described but the present invention is not limited to the embodiment described below. The embodiment described below includes technically preferable limitations in order to carry out the present invention but the limitations are not indispensable requirements of the present invention.

[Nitride Semiconductor Light Emitting Device]

First, the entire configuration of a nitride semiconductor light emitting device 10 of this embodiment is described with reference to FIG. 1 to FIG. 3.

Figure 1:
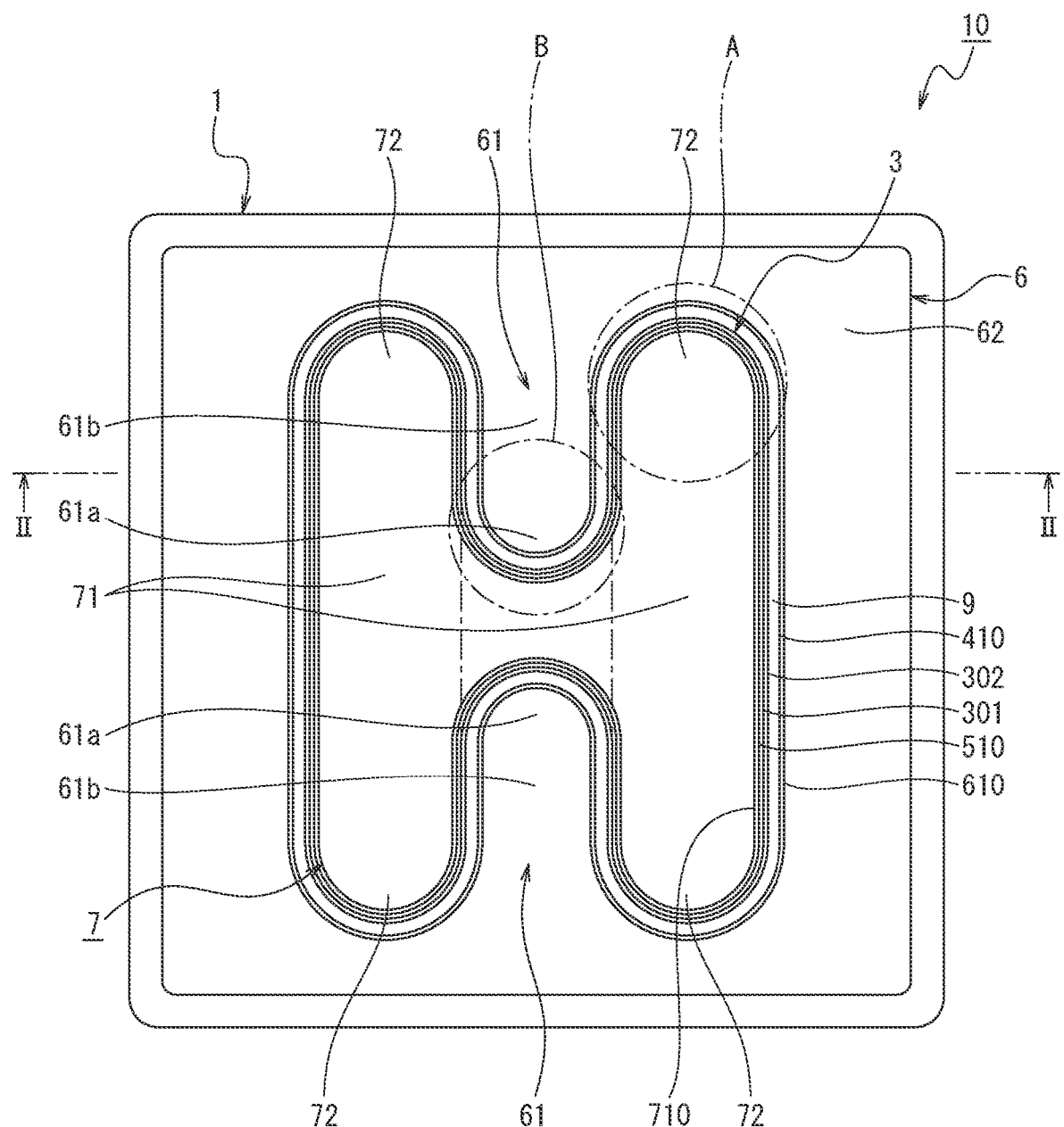
FIG. 1 is a plane view explaining a nitride semiconductor light emitting device of one embodiment of the present invention.
Figure 2:
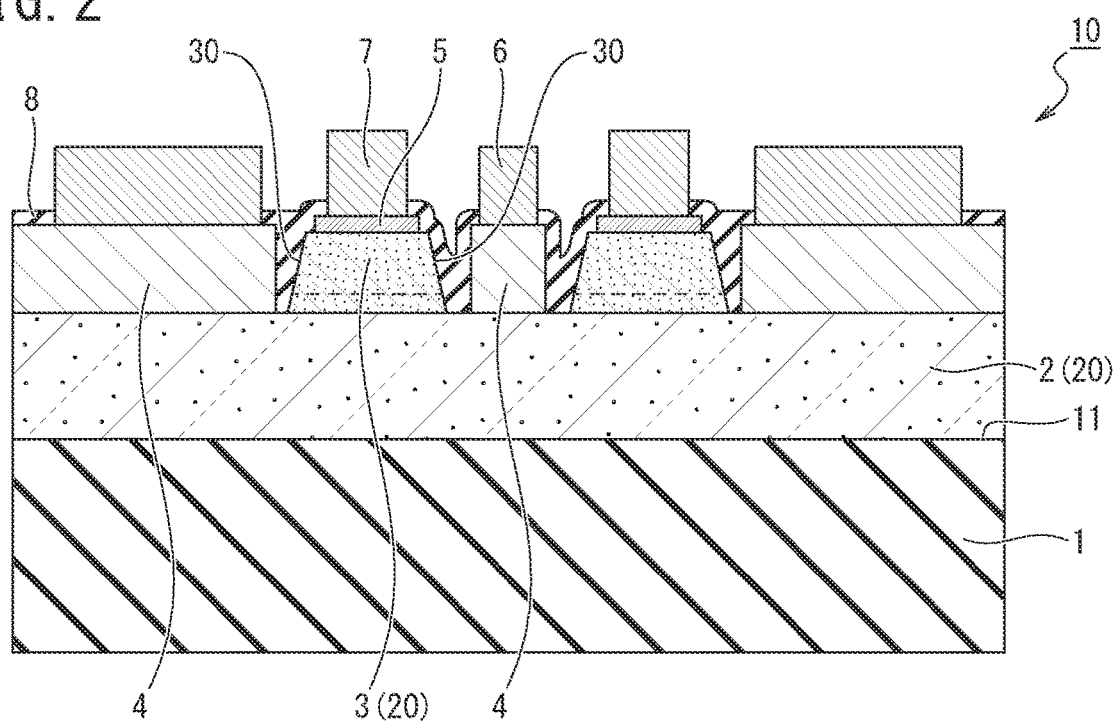
FIG. 2 is across-sectional view illustrating the nitride semiconductor light emitting device of one embodiment of the present invention and is a figure corresponding to a cross-sectional view along the ||-|| line of FIG. 1.

As illustrated in FIG. 1 and FIG. 2, the nitride semiconductor light emitting device 10 has a substrate 1, an n-type nitride semiconductor layer (first nitride semiconductor layer having a first conductivity type) 2, a mesa portion 3, an n-type electrode layer (first electrode layer) 4, a p-type electrode layer (second electrode layer) 5, an n-type pad electrode (first plate-shaped electrode) 6, a p-type pad electrode (second plate-shaped electrode) 7, and an insulating layer 8. In FIG. 1, the insulating layer 8 is omitted, and with regard to the n-type electrode layer 4 and the p-type electrode layer 5, only visible outlines 410 and 510 are respectively illustrated.

The n-type nitride semiconductor layer 2 is formed on one surface 11 of the substrate 1. The mesa portion 3 is formed in one part on the n-type nitride semiconductor layer 2. As illustrated in FIG. 3, the n-type nitride semiconductor layer 2 and the mesa portion 3 configure a nitride semiconductor laminate 20 and a side surface 30 of the mesa portion 3 is an inclined surface. In the mesa portion 3, an n-type nitride semiconductor layer 31, a nitride semiconductor light emitting layer 32, a composition gradient layer 33, and a p-type nitride semiconductor layer (second conductivity type second nitride semiconductor layer) 34 are formed in this order from the substrate 1 side.

Figure 3:
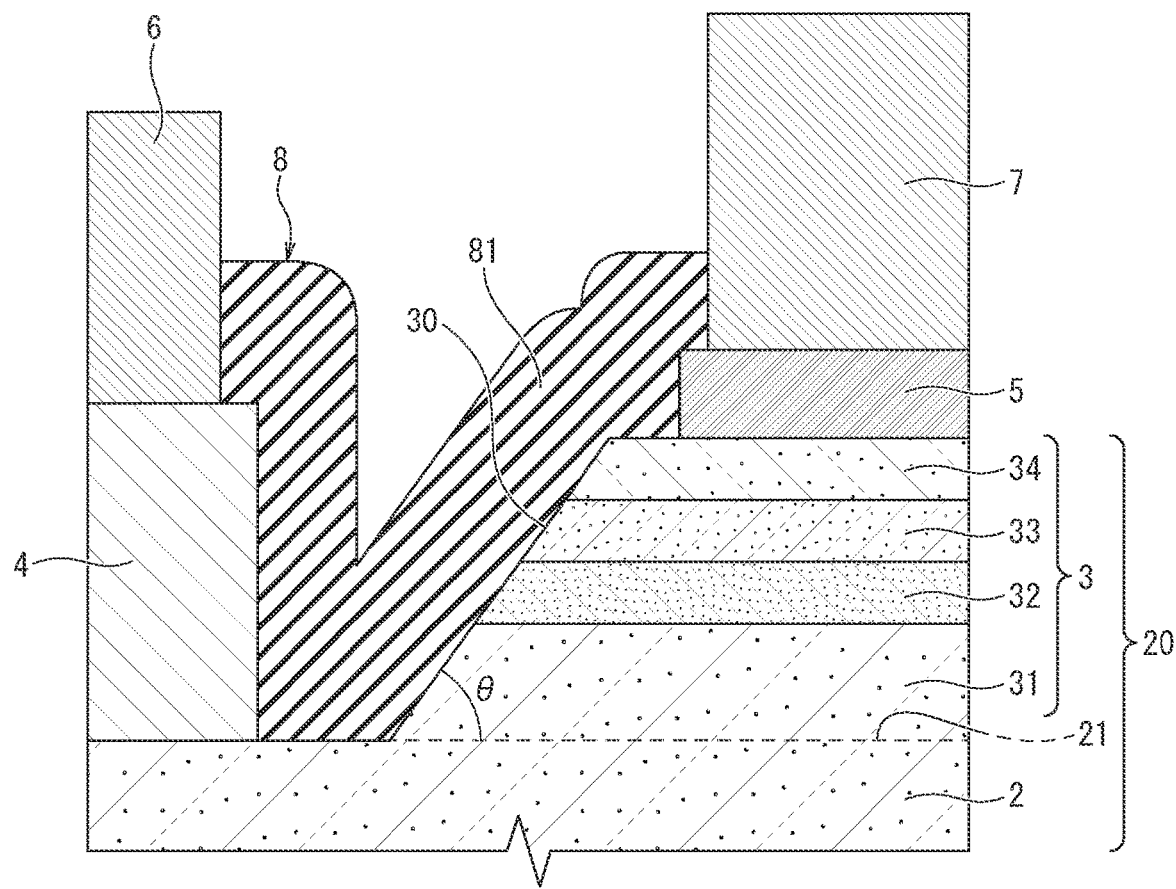
FIG. 3 is a partially enlarged view of FIG. 2.

As illustrated in FIG. 3, the n-type nitride semiconductor layer 31 of the mesa portion 3 is continuously formed on the n-type nitride semiconductor layer 2. By mesa etching for forming the mesa portion 3, the nitride semiconductor laminate 20 present in a portion where the n-type electrode layer 4 is to be formed is removed in the middle of the thickness direction of the n-type nitride semiconductor layer 2.

The n-type electrode layer 4 is formed in a portion except the above-described one part (portion where the mesa portion 3 is not formed) on the n-type nitride semiconductor layer 2. The p-type electrode layer 5 is formed on a p-type nitride semiconductor layer 34. The n-type pad electrode 6 is formed on the n-type electrode layer 4. The p-type pad electrode 7 is formed on the p-type electrode layer 5.

The nitride semiconductor light emitting device 10 is an element emitting ultraviolet light with a peak wavelength range of 300 nm or less. The substrate 1 is not particularly limited in so far as a nitride semiconductor layer can be formed on the one surface 11. Specific examples of materials forming the substrate 1 include sapphire, Si, SiC, MgO, $Ga_2O_3$, $Al_2O_3$, ZnO, GaN, InN, AlN, or a mixed crystal thereof and the like. The use of a substrate formed of nitride semiconductors, such as GaN, AlN, and AlGaN, among the above is preferable because a nitride semiconductor layer in which a lattice constant difference between the lattice constant thereof and the lattice constant of each nitride semiconductor layer formed on the substrate 1 is small and defects or dislocations are hard to occur can be grown, and thus an AlN substrate is more preferably used. Moreover, impurities may be included in the materials forming the substrate 1.

Materials forming the n-type nitride semiconductor layer 2 and the n-type nitride semiconductor layer 31 are preferably single crystals or alloys of AlN, GaN, and InN, and n-$Al_xGa_{(1-x)}N$ (x≥0.4) is mentioned as a specific example.

The materials may contain impurities, such as Group V elements other than N, such as P, As, and Sb, C, H, F, O, Mg, Si, and the like.

The nitride semiconductor light emitting layer 32 may be a monolayer or a multilayer and is, for example, a layer having a multi quantum well structure (MQW) containing a quantum well layer containing AlGaN and an electron barrier layer containing AlGaN. The nitride semiconductor light emitting layer 32 may contain impurities, such as Group V elements other than N, such as P, As, and Sb, C, H, F, 0, Mg, Si, and the like.

Examples of the p-type nitride semiconductor layer 34 include a p-GaN layer, a p-AlGaN layer, and the like, for example, and the p-GaN layer is preferable. The p-type nitride semiconductor layer 34 may contain impurities, such as Mg, Cd, Zn, and Be.

The composition gradient layer 33 is an $Al_xGa_{(1-x)}N$ (0≤x≤1) composition gradient layer. The Ga concentration increases toward the p-type nitride semiconductor layer 34 side (p-type electrode layer side) from the nitride semiconductor light emitting layer 32 side (substrate side). The composition gradient layer 33 brings about an action that holes are easily injected. As an example of the composition gradient layer 33, a layer is mentioned in which the Al composition ratio x of $Al_xGa_{(1-x)}N$ continuously varies from 1 to 0 from the nitride semiconductor light emitting layer 32 toward the p-type nitride semiconductor layer 34. The composition gradient layer 33 may be formed of materials in which impurities, such as Group V elements other than N, such as P, As, and Sb, C, H, F, 0, Mg, Si, and the like are contained in $Al_xGa_{(1-x)}N$.

The insulating layer 8 is formed in a portion which is not covered with the n-type electrode layer 4 of the n-type nitride semiconductor layer 2, a portion which is not covered with the p-type electrode layer 5 of the semiconductor laminate 3, a portion which is not covered with the n-type pad electrode 6 of the n-type electrode layer 4, a portion which is not covered with the p-type pad electrode 7 of the p-type electrode layer 5, and the side surfaces of lower portions of the n-type pad electrode 6 and the p-type pad electrode 7. Examples of materials of the insulating layer 8 include SiN or oxides or nitrides, such as $SiO_2$, SiON, $Al_2O_3$, and ZrO layers, for example, but are not limited thereto.

As materials of the n-type electrode layer 4, materials corresponding to those of the n-type electrode layer of general nitride semiconductor light emitting devices are usable when aiming at the injection of electrons into the nitride semiconductor element 10. For example, Ti, Al, Ni, Au, Cr, V, Zr, Hf, Nb, Ta, Mo, W, and an alloy thereof, or ITO and the like are applied.

As materials of the p-type electrode layer 5, the same materials as those of the p-type electrode layer of general nitride semiconductor light emitting devices are usable when aiming at the injection of holes into the nitride semiconductor light emitting device 10. For example, Ni, Au, Pt, Ag, Rh, Pd, Pt, Cu, and an alloy thereof, or ITO and the like are applied. The materials of the p-type electrode layer 5 are preferably Ni, Au, or an alloy thereof, or ITO with low contact resistance with a nitride semiconductor layer.

Examples of materials of the n-type pad electrode 6 and the p-type pad electrode 7 include Au, Al, Cu, Ag, W, and the like, for example, and Au with high conductivity is preferable.

Figure 4:
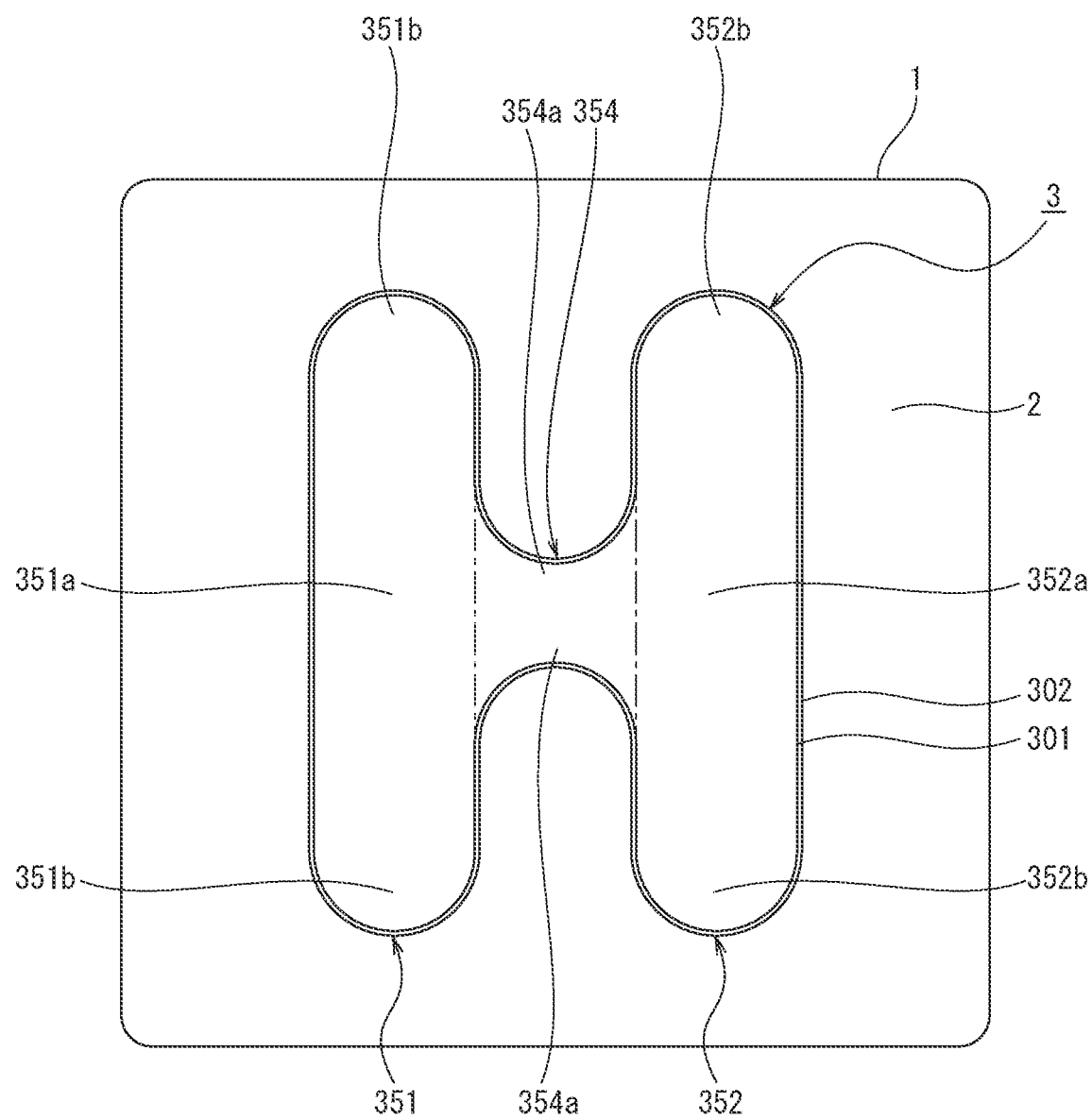
FIG. 4 is a plane view illustrating a state where a first nitride semiconductor layer and a nitride semiconductor laminate are formed on a substrate in the nitride semiconductor light emitting device of FIG. 1.

Next, the planar shape of the mesa portion 3 of the nitride semiconductor light emitting device 10 is described with reference to FIG. 4. In FIG. 4, a visible outline 301 of the upper surface of the mesa portion 3 and a visible outline 302 of the lower surface are seen. A surface between the visible outline 301 and the visible outline 302 is equivalent to the side surface 30 of an inclined shape. In FIG. 4, the first nitride semiconductor layer 2 present in a portion where the mesa portion 3 is not formed on the substrate 1 is seen.

As illustrated in FIG. 4, the planar shape of the mesa portion 3 contains two rod-like portions 351 and 352 having the same length along one side of a rectangle forming the substrate 1 and one connection portion 354 located between the rod-like portion 351 and the rod-like portion 352 adjacent to each other.

The two rod-like portions 351 and 352 have semicircular convex-shaped tip portions 351b and 352b in both end portions in the lengthwise direction of belt like straight portions (base portion) 351a and 352a. The connection portion 354 is present in a central portion in the lengthwise direction of the two rod-like portions 351 and 352. Both end portions in a direction parallel to the lengthwise direction of the rod-like portions 351 and 352 of the connection portion 354 form semicircular concave portions 354a. Thus, the planar shape of the mesa portion 3 is a shape containing the convex-shaped tip portions 351b and 352b formed by a curved line and the base portions 351a and 352a continuous to the convex-shaped tip portions 351b and 352b.

Next, the planar shape of the n-type electrode layer 4 of the nitride semiconductor light emitting device 10 is described with reference to FIG. 5. The planar shape of the n-type electrode layer 4 has sandwiched portions 41 and a peripheral portion 42 which is a portion other than the sandwiched portions 41. The sandwiched portions 41 are portions sandwiched between the rod-like portion 351 and the rod-like portion 352 of the mesa portion 3. The sandwiched portions 41 each have a semicircular convex-shaped tip portion 41a and a straight portion (base portion) 41b. The convex-shaped tip portions 41a are portions facing the concave portions 354a of the mesa portion 3. The straight portions 41b are portions facing the straight portions 351a and 352a of the mesa portion 3. Thus, the planar shape of the n-type electrode layer 4 is a shape containing the convex-shaped tip portions 41a formed by a curved line and the base portions 41b continuous to the convex-shaped tip portions 41a.

Figure 6:
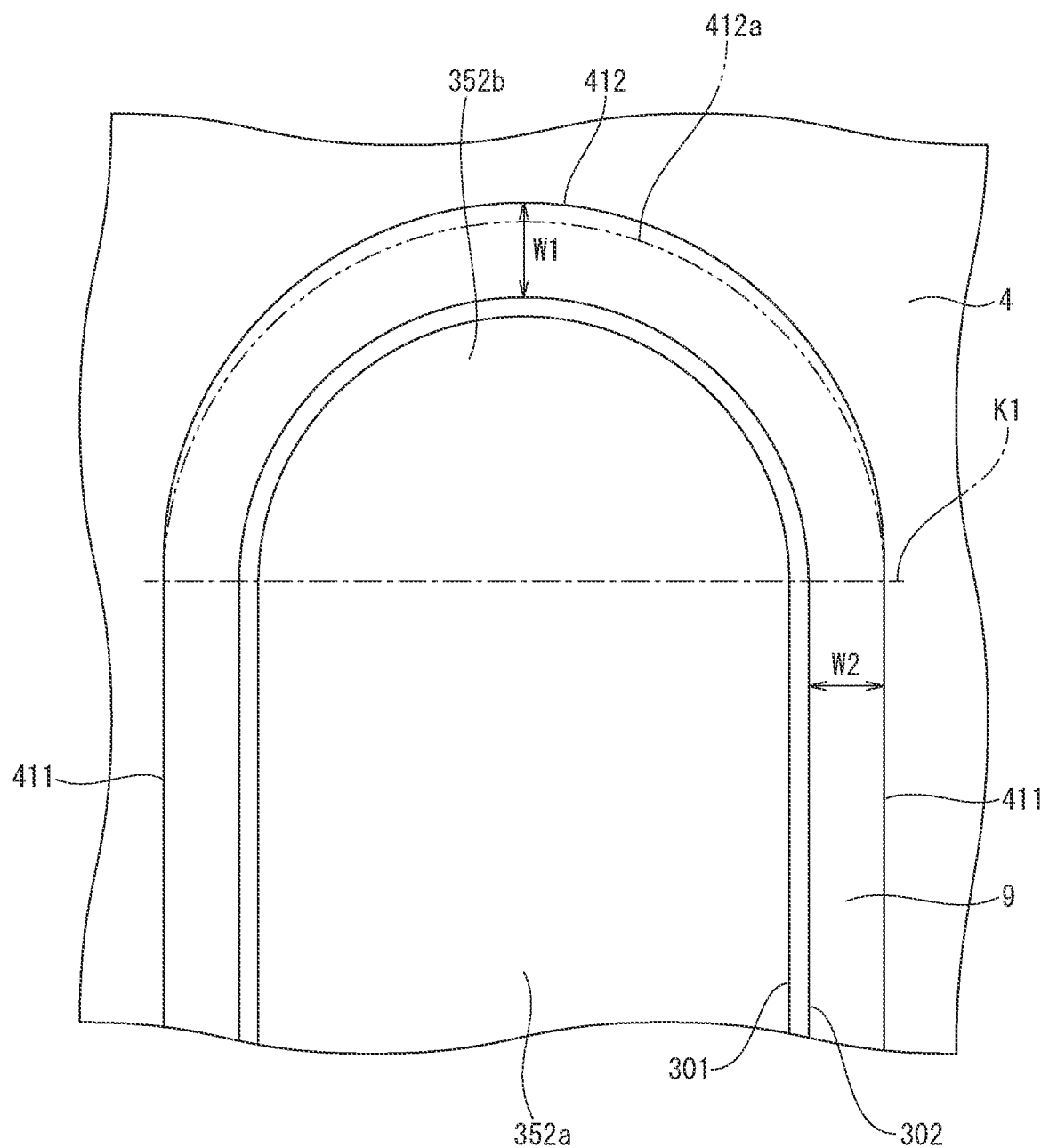
FIG. 6 is an enlarged view of an A portion of FIG. 5.
Figure 7:
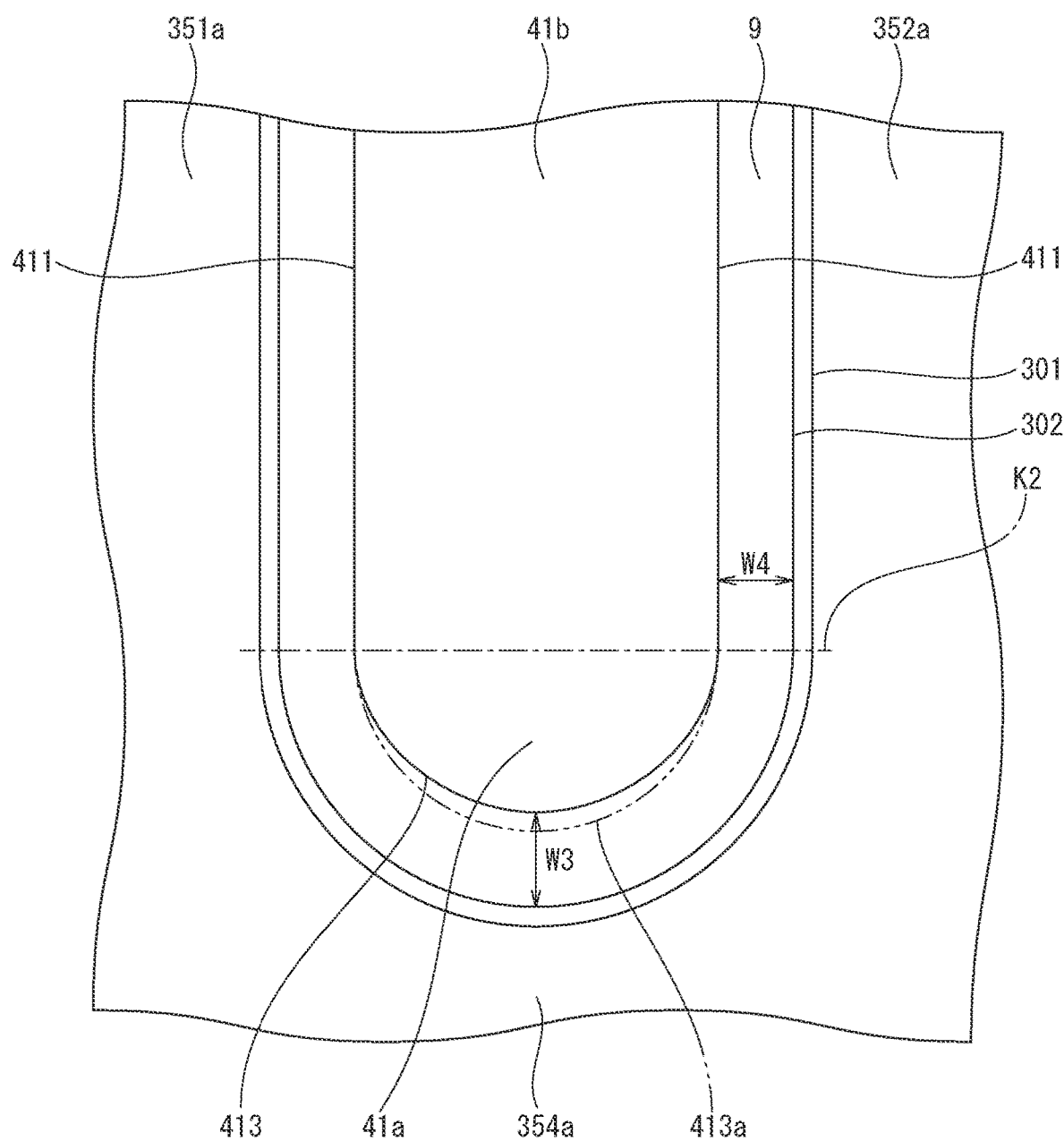
FIG. 7 is an enlarged view of a B portion of FIG. 5.

Next, the relationship between the visible outline 302 on the lower side of the mesa portion 3 and visible outlines 410 and 420 of the n-type electrode layer 4 in the nitride semiconductor light emitting device 10 is described with reference to FIG. 5 to FIG. 7. In FIG. 6, the convex-shaped tip portion 352b and a peripheral portion thereof of the mesa portion 3 in FIG. 5 are enlarged. In FIG. 7, the concave portion 354a and a peripheral portion thereof of the mesa portion 3 in FIG. 5 are enlarged.

Figure 5:
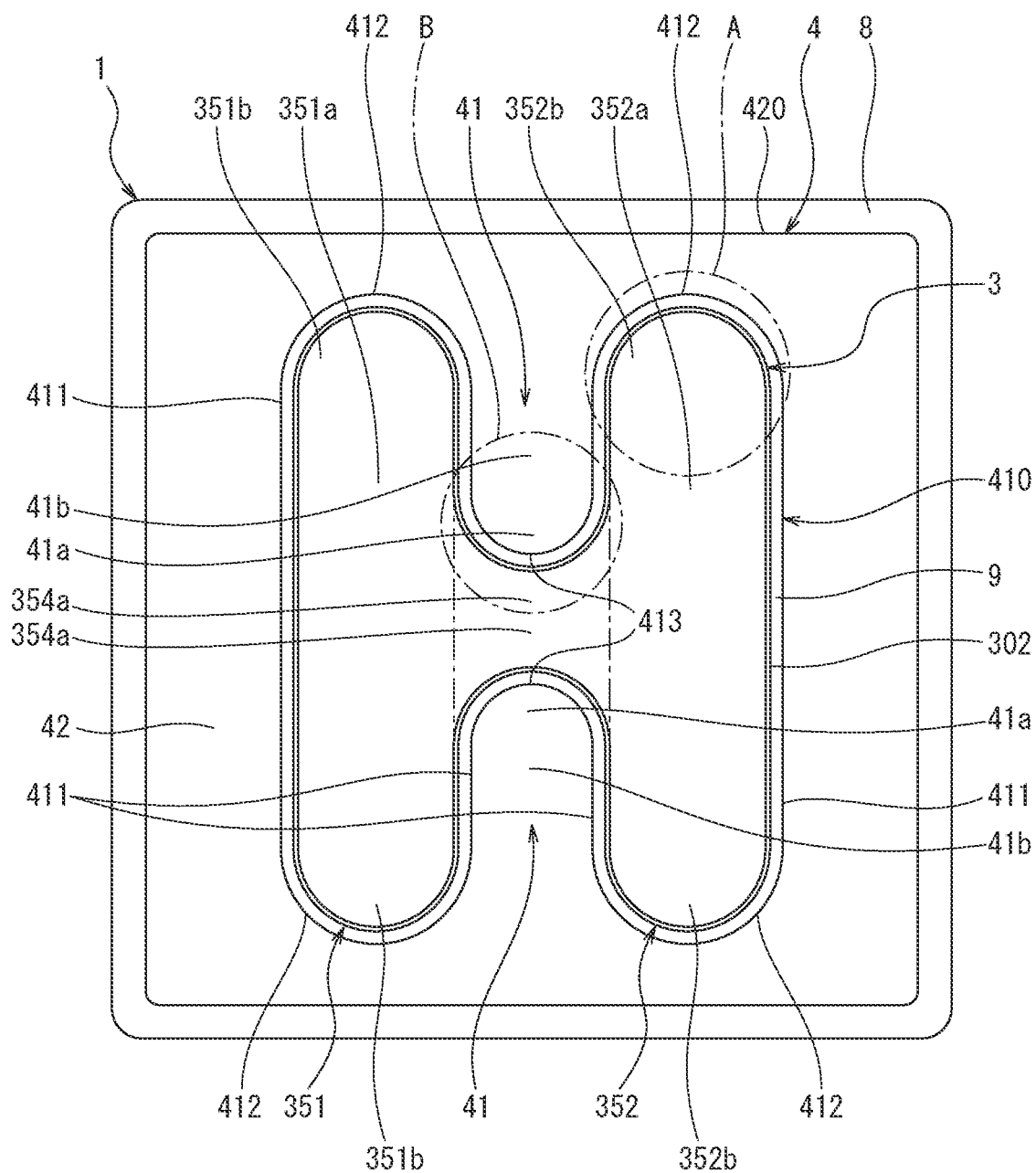
FIG. 5 is a plane view illustrating the relationship between a visible outline of a mesa portion and a visible outline of a first electrode layer in the nitride semiconductor light emitting device of FIG. 1.

As illustrated in FIG. 5, the n-type electrode layer 4 has the visible outline 410 along the visible outline 302 of the mesa portion 3 through a gap 9 and the visible outline 420 similar to the planar shape of the substrate 1 and present somewhat inside relative to a visible outline of the substrate 1 in planar view. More specifically, the n-type electrode layer 4 has a shape in which the visible outline 410 is along the visible outline 302 of the mesa portion 3 through the gap 9. The visible outline 410 contains straight lines 411, concave-shaped curved lines 412, and convex-shaped curved lines 413.

As illustrated in FIG. 6, W1 defined as an interval (interval in the portion where the visible outline 302 forms the convex-shaped tip portion 352b) of the gap 9 in the convex-shaped tip portion 352b of the mesa portion 3 is larger than W2 defined as an interval (interval in the portion where the visible outline 302 forms the straight portion 352a) of the gap 9 in the straight portion 352a of the mesa portion 3. More specifically, W1>W2 is established.

Specifically, the interval W2 of the gap 9 in the straight portion 352a is constant and the interval W1 of the gap 9 in the convex-shaped tip portion 352b gradually increases toward a top portion of the convex-shaped tip portion 352b from a boundary line K1 between the straight portion 352a and the convex-shaped tip portion 352b. More specifically, the concave-shaped curved line 412 of the visible outline 410 of the n-type electrode layer 4 is formed to be located outside an arc 412a in which the distance between the straight lines 411 of the visible outline 410 is a diameter.

The above description of the relationship between the convex-shaped tip portion 352b and the straight portion 352a about the rod-like portion 352 similarly applies also to the rod-like portion 351.

Thus, by setting the interval of the gap 9 to be larger in the convex-shaped tip portions 351b and 352b where current concentration is likely to occur than in the straight portions 351a and 352a in the mesa portion 3, the same current concentration suppression effect (current diffusion action in the convex-shaped tip portions 351b and 352b) as that in a case where a high resistor is disposed only in the convex-shaped tip portions 351b and 352b is obtained.

Moreover, the interval of the gap 9 can be set to be larger in the convex-shaped tip portions 351b and 352b than in the straight portions 351a and 352a only by forming the mask shape in the formation of the n-type electrode layer 4 to correspond to the dimension difference. More specifically, the current concentration suppression effect is obtained at a low cost without increasing a manufacturing process.

As illustrated in FIG. 7, W3 defined as an interval (interval in the portion where the visible outline 410 forms the convex-shaped tip portion 41a) of the gap 9 in the convex-shaped tip portion 41a of the n-type electrode layer 4 is larger than W4 defined as an interval (interval in the portion where the straight portion 41b is formed) W4 of the gap 9 in the straight portion 41b. More specifically, W3>W4 is established.

Specifically, the interval W4 of the gap 9 in the straight portion 41b is constant and the interval W3 of the gap 9 in the convex-shaped tip portion 41a gradually increases toward a top portion of the convex-shaped tip portion 41a from a boundary line K2 between the straight portion 41b and the convex-shaped tip portion 41a. More specifically, the convex-shaped curved line 413 of the visible outline 410 of the n-type electrode layer 4 is formed to be located inside an arc 413a in which the distance between the straight lines 411 of the visible outline 410 is a diameter.

Thus, by setting the interval of the gap 9 to be larger in the convex-shaped tip portion 41a where current concentration is likely to occur than in the straight portion 41b in the n-type electrode layer 4, the same current concentration suppression effect (current diffusion action in the convex-shaped tip portion 41a) as that in a case where a high resistor is disposed only in the convex-shaped tip portion 41a is obtained.

Moreover, the interval of the gap 9 can be set to be larger in the convex-shaped tip portion 41a than in the straight portion 41b only by setting the mask shape in the formation of the n-type electrode layer 4 to correspond to the dimension difference. More specifically, effect of the current spreading is obtained at a low cost without increasing the manufacturing process.

Next, an angle θ of the side surface 30 of the mesa portion 3 is described with reference to FIG. 3 and FIG. 6. The angle θ is an angle formed by the side surface 30 and a surface (boundary surface between the n-type nitride semiconductor layer 2 and the mesa portion 3) 21 parallel to one surface (surface on which the first nitride semiconductor layer is formed) 11 of the substrate 1. The angle θ illustrated in FIG. 3 is smaller in the convex-shaped tip portion 352b of the mesa portion 3 illustrated in FIG. 6 than in the straight portion (base portion) 352a thereof.

Thus, by setting the angle θ to be smaller in the convex-shaped tip portions 351b and 352b where current concentration is likely to occur than in the straight portions 351a and 352a in the mesa portion 3, current concentration in a rise portion of the mesa portion 3 in the convex-shaped tip portions 351b and 352b is suppressed.

Moreover, the angle θ can be set to be smaller in the convex-shaped tip portions 351b and 352b than in the straight portions 351a and 352a by inductively coupled reactive ion etching divided into two processes, for example. For example, the angle θ can be set by exposing the straight portions 351a and 352a, masking a portion other than the straight portions 351a and 352a with resist, performing etching with high bias electric power, exposing the convex-shaped tip portions 351b and 352b, masking a portion other than the convex-shaped tip portions 351b and 352b with resist, and then performing etching with high antenna power. More specifically, the nitride semiconductor light emitting device 10 is obtained at a low cost as compared with a case where a high resistor is provided.

Next, the thickness of an insulating layer (side surface insulating layer) 81 formed on the side surface 30 of the mesa portion 3 is described with reference to FIG. 3 and FIG. 6. The thickness of the side surface insulating layer 81 illustrated in FIG. 3 is larger in the convex-shaped tip portion 352b of the mesa portion 3 illustrated in FIG. 6 than in the straight portion (base portion) 352a thereof.

Thus, due to the fact that the thickness of the side surface insulating layer 81 is larger in the convex-shaped tip portions 351b and 352b where current concentration is likely to occur than in the straight portions 351a and 352a in the mesa portion 3, corrosion of the mesa portion 3 caused by current concentration can be effectively prevented. As a result, an output reduction caused by the corrosion of the nitride semiconductor light emitting device 10 is prevented, and thus the longer lifetime is achieved.

Moreover, the side surface insulating layer 81 can be formed to be thicker in the convex-shaped tip portions 351b and 352b than in the straight portions 351a and 352a by forming the straight portions 351a and 352a and the convex-shaped tip portions 351b and 352b while changing time in a two-stage film forming process, for example.

Next, the relationship between the p-type electrode layer 5 and the p-type pad electrode 7 of the nitride semiconductor light emitting device 10 is described with reference to FIG. 1, FIG. 4, and FIG. 8.

As illustrated in FIG. 1, the planar shape of the p-type electrode layer 5 has the visible outline 510 along the visible outline 301 of the mesa portion 3 illustrated in FIG. 4. More specifically, the planar shape of the p-type electrode layer 5 has convex-shaped tip portions 52 formed on the convex-shaped tip portions 351b and 352b of the mesa portion 3 and straight portions (base portion) 51 formed on the straight portions 351a and 352a of the mesa portion 3. Thus, the planar shape of the p-type electrode layer 5 is a shape containing the convex-shaped tip portions 52 formed by a curved line and the base portions 51 continuous to the convex-shaped tip portions 52. Moreover, as illustrated in FIG. 8, the visible outline 510 of the p-type electrode layer 5 is divided into straight lines 511 forming the straight portions 51 and a convex-shaped curved line 512 forming the convex-shaped tip portion 52.

Figure 8:
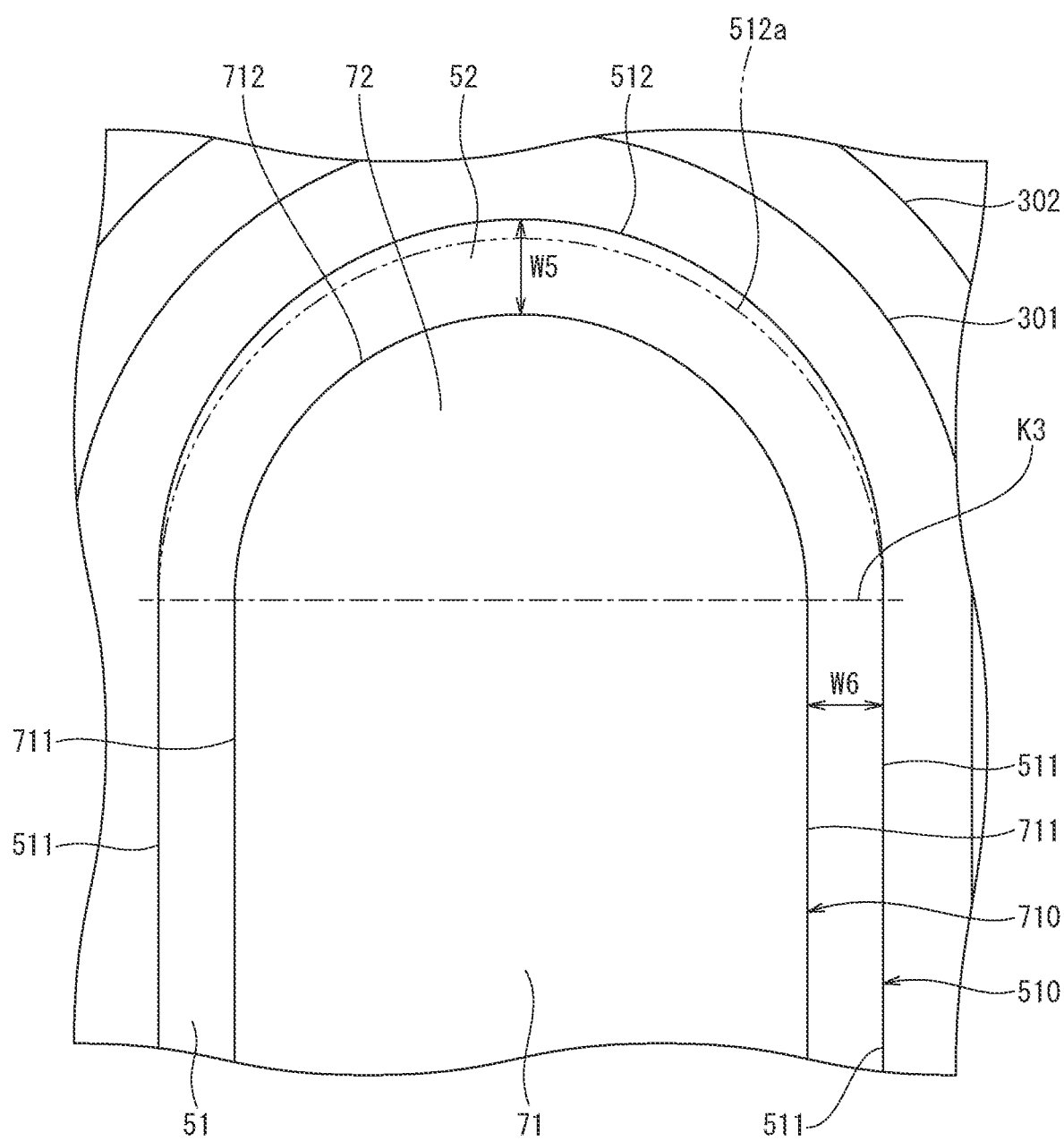
FIG. 8 is an enlarged view of an A portion of FIG. 1.

As illustrated in FIG. 1 and FIG. 8, the planar shape of the p-type pad electrode 7 has a straight portion (base portion) 71 formed on the straight portion 51 of the p-type electrode layer 5 and a convex-shaped tip portion 72 formed on the convex-shaped tip portion 52 thereof. A visible outline 710 of the p-type pad electrode 7 is located inside the visible outline 510 of the p-type electrode layer 5 in planar view. As illustrated in FIG. 8, the visible outline 710 of the p-type pad electrode 7 is divided into straight lines 711 forming the straight portion 71 and a convex-shaped curved line 712 forming the convex-shaped tip portion 72.

In FIG. 8, the convex-shaped tip portion 72 and a peripheral portion thereof of the p-type pad electrode 7 in FIG. 1 are enlarged. As illustrated in FIG. 8, with respect to the interval between the visible outline 710 of the p-type pad electrode 7 and the visible outline 510 of the p-type electrode layer 5, an interval W5 between the convex-shaped curved lines 512 and 712 is larger than an interval W6 between the straight lines 511 and 711. More specifically, the interval W5 between the visible outline (convex-shaped curved line) 712 of the p-type pad electrode 7 and the visible outline (convex-shaped curved line) 512 of the p-type electrode layer 5 in the convex-shaped tip portion 52 of the p-type electrode layer 5 is larger than the interval W6 between the visible outline (straight line) 711 of the p-type pad electrode 7 and the visible outline (straight line) 511 of the p-type electrode layer 5 in the straight portion (base portion) 51. More specifically, W5>W6 is established.

Specifically, the interval W6 in the straight portion 51 is constant and the interval W5 in the convex-shaped tip portion 52 gradually increases toward a top portion of the convex-shaped tip portion 52 from a boundary line K3 between the straight portion 51 and the convex-shaped tip portion 52. More specifically, the visible outline (convex-shaped curved line of the visible outline 510 of the p-type electrode layer 5) 512 in the convex-shaped tip portion 52 of the p-type electrode layer 5 is formed to be located outside an arc 512a in which the distance between the straight lines 511 of the visible outline 510 is the diameter.

Thus, by setting the interval between the visible outline 710 of the p-type pad electrode 7 and the visible outline 510 of the p-type electrode layer 5 to be larger in the convex-shaped tip portion 52 of the p-type electrode layer 5 where current concentration is likely to occur than in the straight portion 51, a current movement length from the p-type pad electrode 7 to the visible outline 510 of the p-type electrode layer 5 increases in the convex-shaped tip portion 52, and thus a current diffusion action is correspondingly obtained. The current concentration suppression effect is obtained also by this action.

The interval between the visible outline 710 of the p-type pad electrode 7 and the visible outline 510 of the p-type electrode layer 5 can be made larger in the convex-shaped tip portion 52 than in the straight portion 51 only by forming the mask shape in the formation of the p-type pad electrode 7 to reflect the interval difference. More specifically, the current concentration suppression effect is obtained at a low cost without increasing the manufacturing process.

Next, the relationship between the n-type electrode layer 4 and the n-type pad electrode 6 of the nitride semiconductor light emitting device 10 is described with reference to FIG. 1, FIG. 5, and FIG. 9.

As illustrated in FIG. 1, the planar shape of the n-type pad electrode 6 has sandwiched portions 61 formed on the sandwiched portions 41 of the n-type electrode layer 4 and a peripheral portion 62 formed on the peripheral portion 42 of the n-type electrode layer 4. The sandwiched portions 61 each have a convex-shaped tip portion 61a formed on the convex-shaped tip portion 41a of the n-type electrode layer 4 and a straight portion (base portion) 61b formed on the straight portion 41b of the n-type electrode layer 4. In the sandwiched portions 41 of the n-type electrode layer 4, a visible outline 610 of the n-type pad electrode 6 is located inside the visible outline 410 of the n-type electrode layer 4 in planar view. In the peripheral portion 42, the visible outline 610 of the n-type pad electrode 6 is located outside the visible outline 410 of the n-type electrode layer 4 in planar view. As illustrated in FIG. 9, the visible outline 610 of the sandwiched portion 61 of the n-type pad electrode 6 is divided into straight lines 611 forming the straight portion 61b and a convex-shaped curved line 612 forming the convex-shaped tip portion 61a.

Figure 9:
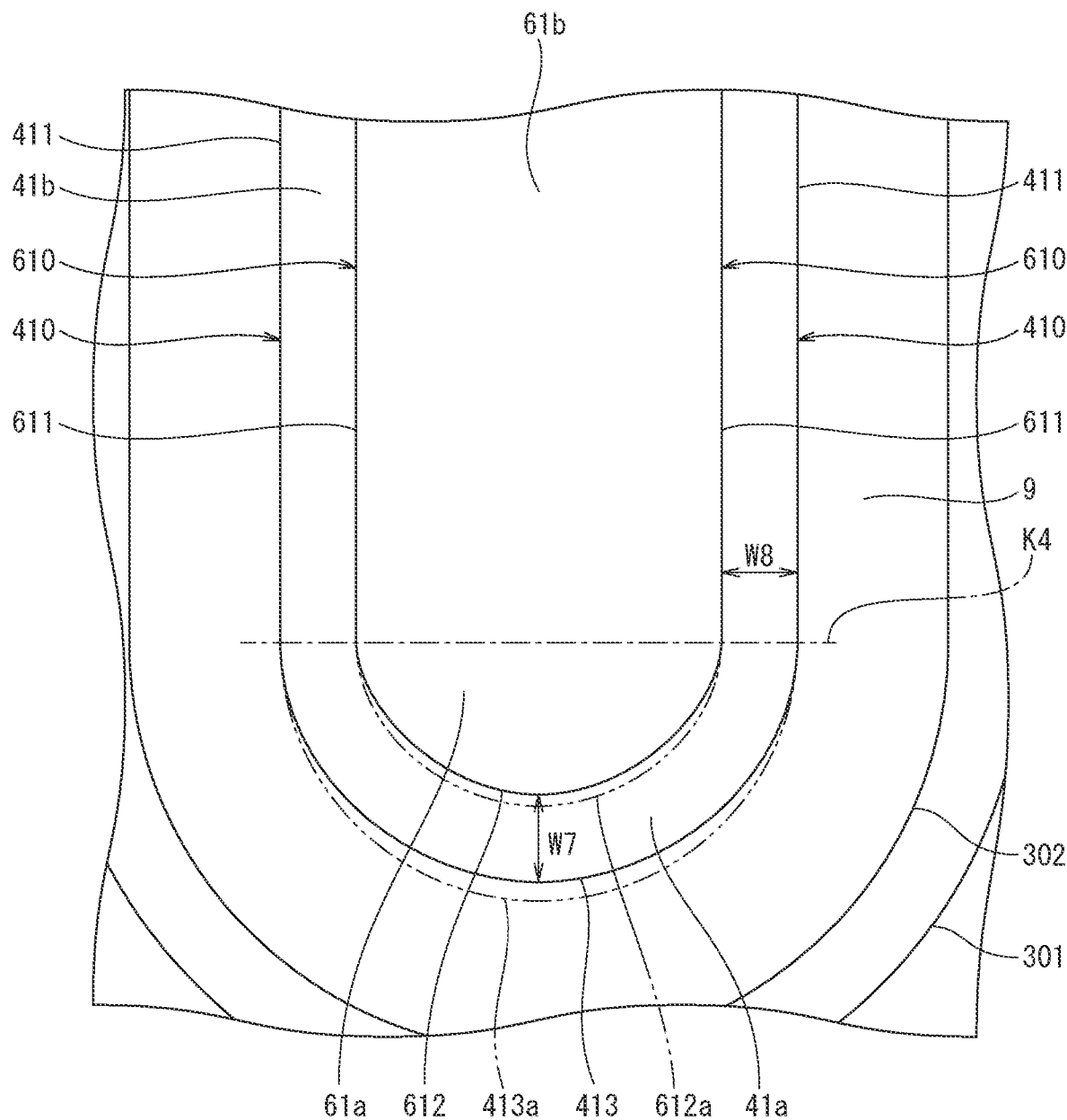
FIG. 9 is an enlarged view of a B portion of FIG. 1.

In FIG. 9, the convex-shaped tip portion 61a and a peripheral portion thereof of the n-type pad electrode 6 in FIG. 1 are enlarged. As illustrated in FIG. 9, with respect to the interval between the visible outline 610 of the n-type pad electrode 6 and the visible outline 410 of the n-type electrode layer 4, an interval W7 in the convex-shaped curved line 413 of the n-type electrode layer 4 is larger than an interval W8 in the straight line 411. More specifically, the interval W7 between the visible outline (convex-shaped curved line) 612 of the n-type pad electrode 6 and the visible outline (convex-shaped curved line) 412 of the n-type electrode layer 4 in the convex-shaped tip portion 41a of the sandwiched portion 41 is larger than the interval W8 between the visible outline (straight line) 611 of the n-type pad electrode 6 and the visible outline (straight line) 411 of the n-type electrode layer 4 in the straight portion (base portion) 41b. More specifically, W7>W8 is established.

Specifically, the interval W8 in the straight portion 41b is constant and the interval W7 in the convex-shaped tip portion 41a gradually increases toward a top portion of the convex-shaped tip portion 41a from a boundary line K4 between the straight portion 41b and the convex-shaped tip portion 41a. More specifically, the visible outline (convex-shaped curved line of the visible outline 610 of the n-type pad electrode 6) 612 in the convex-shaped tip portion 61a of the n-type pad electrode 6 is formed to be located inside a curved line 612a having an equal interval with respect to the convex-shaped curved line 413 of the n-type electrode layer 4.

Thus, by setting the interval between the visible outline 610 of the n-type pad electrode 6 and the visible outline 410 of the n-type electrode layer 4 to be larger in the convex-shaped tip portion 41a of the n-type electrode layer 4 where current concentration is likely to occur than in the straight portion 41b, a current movement length from the n-type pad electrode 6 to the visible outline 410 of the n-type electrode layer 4 increases in the convex-shaped tip portion 41a, and thus a current diffusion action is correspondingly obtained. The current concentration suppression effect is obtained also by this action.

The interval between the visible outline 610 of the n-type pad electrode 6 and the visible outline 410 of the n-type electrode layer 4 can be made larger in the convex-shaped tip portion 41a than in the straight portion 41b only by forming the mask shape in the formation of the p-type pad electrode 6 to reflect the interval difference. More specifically, the current concentration suppression effect is obtained at a low cost without increasing the manufacturing process.

Moreover, the following effects are obtained due to the fact that the mesa portion 3 of the nitride semiconductor light emitting device 10 has the composition gradient layer 33. Since the strain release in the side surface 30 of the mesa portion 3 is higher in the convex-shaped tip portions 351b and 352b than in the straight portions 351a and 352a, the hole generation amount at the end of the composition gradient layer 33 is smaller in the convex-shaped tip portions 351b and 352b than in the straight portions 351a and 352a, and thus a current becomes difficult to flow to the convex-shaped tip portions (convex-shaped tip portion) 351b and 352b.

As described above, the nitride semiconductor light emitting device 10 according to this embodiment is a nitride semiconductor light emitting device in which current concentration is suppressed. As a result, in the nitride semiconductor light emitting device 10, the in-plane nonuniformity of the light emission light quantity is suppressed and local destruction is suppressed, and thus the longer life time is achieved.

Moreover, in the nitride semiconductor light emitting device, the specific resistance is higher in the p-type semiconductor layer than in the n-type semiconductor layer and the contact resistance between the electrode and the semiconductor layer is higher in the p-type electrode than in the n-type electrode in many cases. In the nitride semiconductor light emitting device, when the interval between the mesa portion and the electrode is locally extended, the resistance of the semiconductor layer in the extended portion increases and, when the chip size is the same, the coating area of the electrode relatively becomes smaller, and thus the contact resistance increases.

In the nitride semiconductor light emitting device 10 of this embodiment, by locally extending the interval between the mesa portion 3 and the n-type electrode layer 4, an increase in resistance of the semiconductor layer and an increase in contact resistance between the electrode layer and the semiconductor layer can be made smaller than in a case where the interval between the mesa portion 3 and the p-type electrode layer 5 is extended. In connection therewith, an increase in driving voltage and an increase in heat generation amount decrease, and therefore element destruction is suppressed.

Moreover, the nitride semiconductor light emitting device 10 of this embodiment can be obtained at a low cost without increasing a manufacturing cost as compared with a case where a high resistance layer is provided.

In the nitride semiconductor light emitting device 10 of the above-described embodiment, the convex-shaped tip portions (first portion which is either a corner portion or a curved portion projected outward) of the planar shapes of the mesa portion 3, the n-type electrode layer 4, the p-type electrode layer 5, and the sandwiched portions 41 are the convex-shaped tip portions (curved portion projected outward, such as the semicircular shape) formed by a curved line and the base portions (second portion which is not the corner portion or the curved portion projected outward) are the belt like straight portions but the present invention is not limited thereto. The convex-shaped tip portion (first portion) may be a convex-shaped tip portion (corner portion of a polygon) formed by a plurality of straight lines, in which an obtuse angle is formed by adjacent two straight lines.

Figure 10C:
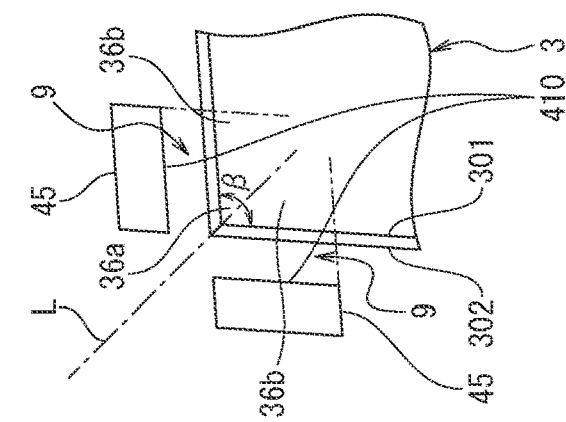
FIG. 10C is a plan view explaining a specific example of a convex-shaped tip portion formed by a plurality of straight lines.
Figure 10B:
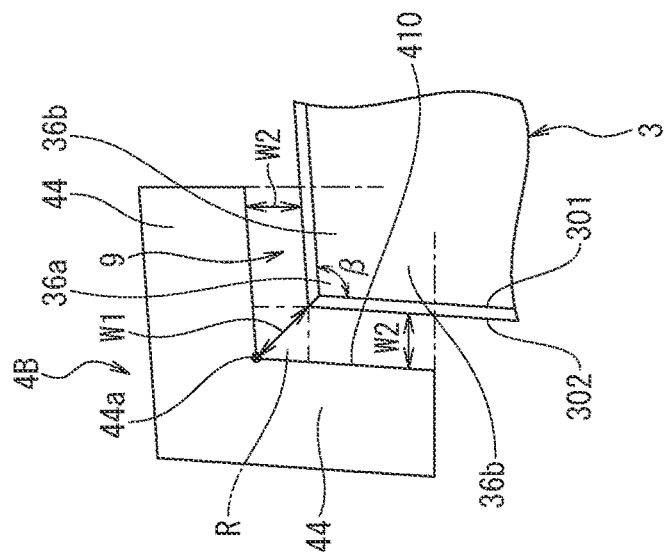
FIG. 10B is a plan view explaining a specific example of a convex-shaped tip portion formed by a plurality of straight lines.
Figure 10A:
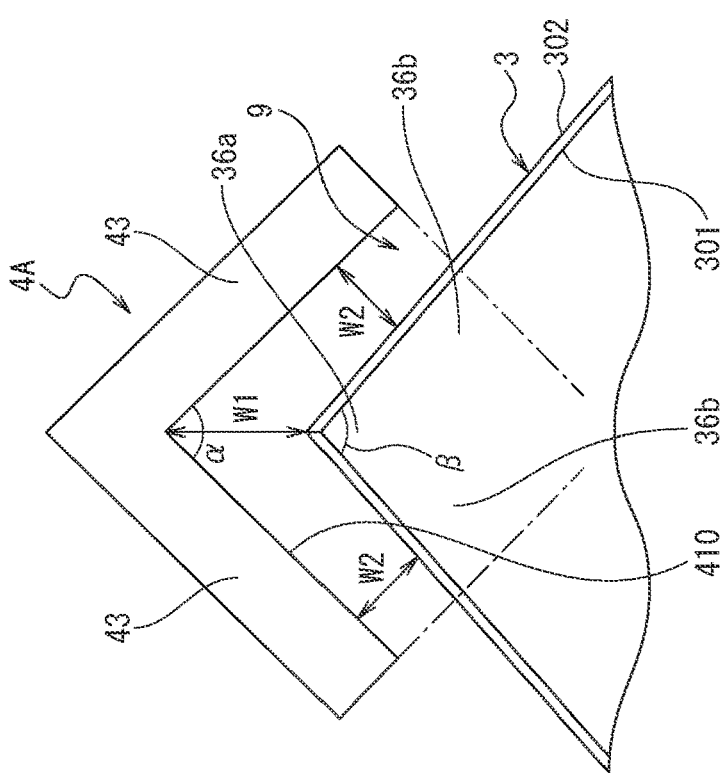
FIG. 10A is a plan view explaining a specific example of a convex-shaped tip portion formed by a plurality of straight lines.

As a specific example of the case (when the first portion is a corner portion) of having the convex-shaped tip portion formed by the plurality of straight lines, the shapes illustrated in FIG. 10A to FIG. 10C are mentioned.

In the example of FIG. 10A, the planar shape of the mesa portion 3 is a shape containing a corner portion (convex-shaped tip portion formed by two straight lines) 36a projected outward and a straight portion (base portion) 36b continuous to both sides of the corner portion 36a. The planar shape of an n-type electrode layer 4A is a shape in which one ends in the longitudinal direction of a pair of belt like portions 43 are overlapped and bonded. An angle α of the interior angle formed by the pair of belt like portions 43 is smaller than an angle β (>90) of the corner portion 36a. More specifically, the mesa portion 3 has visible outlines 301 and 302 containing two sides forming the corner portion 36a in planar view.

The corner portion 36a and the straight portion 36b of the mesa portion 3 are enclosed from the outside through the gap 9 by the n-type electrode layer 4A in planar view. More specifically, the n-type electrode layer 4A has the visible outline 410 along the visible outline 302 of the mesa portion 3 through the gap 9 in planar view.

The interval (interval of the gap 9 in the portion where the visible outline 302 forms the corner portion 36a) W1 of the gap 9 in the convex-shaped tip portion (corner portion 36a) of the mesa portion 3 is larger than the interval (interval in the portion where the straight portion 36b is formed) W2 of the gap 9 in the base portion (straight portion 36b) of the mesa portion 3. More specifically, W1>W2 is established. Specifically, the interval of the gap 9 is the largest at the vertex position of the corner portion 36a and gradually decreases with the distance from the vertex position.

In the example of FIG. 10B, the planar shape of the mesa portion 3 is a shape containing a corner portion (convex-shaped tip portion formed by two straight lines) 36a projected outward and a straight portion (base portion) 36b continuous to both sides of the corner portion 36a. An angle β of the corner portion 36a is an obtuse angle. More specifically, the corner portion 36a contains two sides forming the obtuse angle and the mesa portion 3 has the visible outlines 301 and 302 containing the two sides in planar view. The planar shape of an n-type electrode layer 4B is a shape in which one ends in the longitudinal direction of a pair of belt like portions 44 are overlapped and bonded. An angle α of the interior angle formed by the pair of belt like portions 44 is equal to the angle β (>90) of the corner portion 36a.

The corner portion 36a and the straight portion 36b of the mesa portion 3 are enclosed from the outside by the n-type electrode layer 4A through the gap 9 as in planar view. More specifically, the n-type electrode layer 4B has the visible outline 410 along the visible outline 302 of the mesa portion 3 through the gap 9 in planar view.

The interval (interval of the gap 9 in the portion where the visible outline 302 forms the corner portion 36a) W1 of the gap 9 in the convex-shaped tip portion (corner portion 36a) of the mesa portion 3 is larger than the interval (interval in the portion where the straight portion 36b is formed) W2 of the gap 9 in the base portion (straight portion 36b) of the mesa portion 3. More specifically, W1>W2 is established.

Specifically, the interval W2 of the gap 9 in the straight portion 36b is constant and the interval W1 of the gap 9 in the corner portion 36a is the largest at a position where a vertex 44a of the interior angle of the n-type electrode layer 4B and the vertex of the corner portion 36a face each other and, in the range of a rectangle R in which a straight line connecting the vertex 44a of the n-type electrode layer 4B and the vertex of the corner portion 36a is a diagonal line, the interval W1 of the gap 9 gradually decreases with the distance from the diagonal line.

In the example of FIG. 10C, the planar shape of the mesa portion 3 is a shape containing a corner portion (convex-shaped tip portion formed by two straight lines) 36a projected outward and a straight portion (base portion) 36b continuous to both sides of the corner portion 36a. An angle β of the corner portion 36a is an obtuse angle. More specifically, the corner portion 36a contains two sides forming the obtuse angle and the mesa portion 3 has the visible outlines 301 and 302 containing the two sides in planar view.

The straight portion 36b of the mesa portion 3 is enclosed from the outside by two belt like n-type electrode layers 45 through the gap 9 in planar view. More specifically, the n-type electrode layers 45 have the visible outlines 410 along the visible outline 302 of the mesa portion 3 through the gap 9 in planar view.

Moreover, in each of the two n-type electrode layers 45, one end in the longitudinal direction of the belt like shape is in agreement with the visible outline 302 of the corner portion 36a orthogonal to the longitudinal direction. More specifically, the n-type electrode layer is not present at a position facing the vertex of the corner portion 36a along a straight line L bisecting the angle of the corner portion 36a.

Also by not providing the n-type electrode layer at the position facing the vertex of the corner portion 36a of the mesa portion 3 where current concentration is likely to occur as in the example of FIG. 10C, the same current concentration suppression effect (current diffusion effect in the corner portion) as that in the case where a high resistor is disposed only at the position is obtained.

In the examples of FIG. 10A to FIG. 10C, the convex-shaped tip portions are formed by two straight lines but the convex-shaped tip portions may be formed by three or more straight lines. More specifically, the convex-shaped tip portion may be formed by the polygonal line containing three or more straight lines approximated to a semicircular arc, for example. In the polygonal line, an obtuse angle is formed by adjacent two straight lines.

Simulation of Effects

In this simulation, simulation software manufactured by STR, "SiLENSe" and simulation software manufactured by STR, "SpeCLED" were used.

As a hypothesis of the simulation of the SpeCLED, the planar shapes illustrated in FIG. 4 and FIG. 5 were drawn, and then calculation was performed with the following settings.

<Substrate 1>
  Material: AlN
  Plane dimension: 820 μm×600 μm
  Thickness: 100 μm
<n-Type Semiconductor Layer 2 and 31>
  Thickness: 0.5 μm
  Thermal conductivity: 130 W/cm$^2$/K
  Mobility: 50 cm$^2$/Vs
  Impurity density: 1 e$^{19}$ cm$^{-3}$
<p-Type Semiconductor Layer 33 and 34>
  Thickness: 0.06 μm
  Thermal conductivity: 120 W/cm$^2$/K
  Mobility: 5 cm$^2$/Vs
  Impurity density: 2 e$^{19}$ cm$^{-3}$
<Mesa Portion 3>
  Height: 0.211 μm
<p-Type Electrode Layer 5>
  Thickness: 0.055 μm
<n-Type Electrode Layer 4>
  Thickness: 0.025 μm
<n-Type Pad Electrode 6>
  Thickness: 1 μm, Thermal conductivity: 1 e$^5$ W/m$^2$/K
<p-Type Pad Electrode 7>
  Thickness: 1 μm, Thermal conductivity: 1 e$^5$ W/m$^2$/K
<Others>
  n-type contact resistance: 5 e$^{-3}$ Ω·cm$^2$
  p-type contact resistance: 1 e$^{-3}$ Ω·cm$^2$,
  Current value: 300 mA
  Initial temperature: 300 K The nitride semiconductor light emitting layer 32 was calculated for an MQW spectrum at a wavelength of 265 nm and correlation data of the current density and the voltage at 100 K intervals in a temperature range of from 300 K to 500 K using the "SiLENSe".

Figure 11:
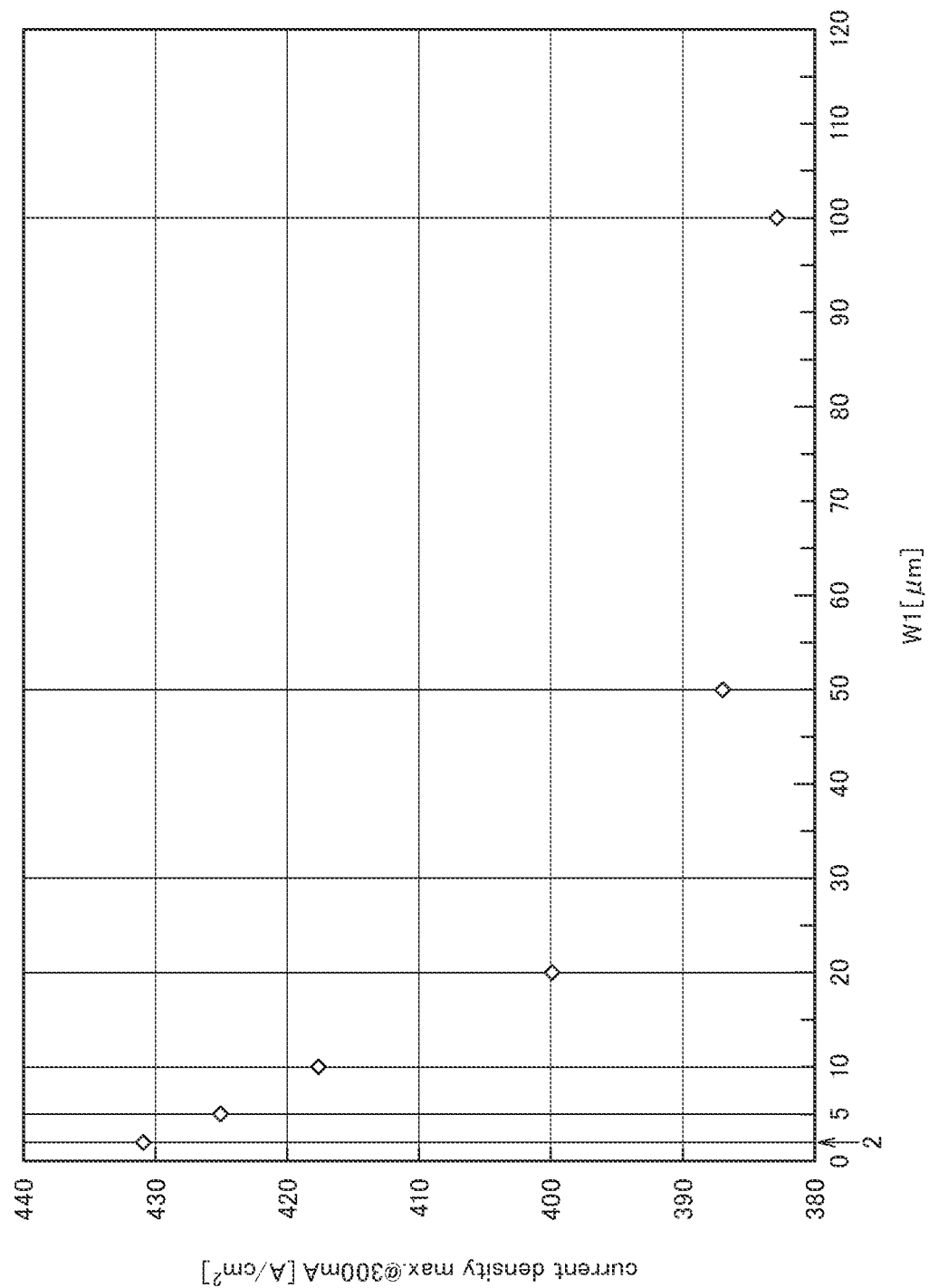
FIG. 11 is a graph illustrating the relationship between W1 and the maximum current density in the case of W2=5 μm created from simulation results.

When the nitride semiconductor light emitting device 10 of the embodiment was investigated for the relationship between the W1 and the maximum current density in the case of W2=5 μm by such a simulation, the relationship illustrated in FIG. 11 was obtained. This result shows that current concentration can be further eased with an increase in "W1–W2".

Figure 12A:
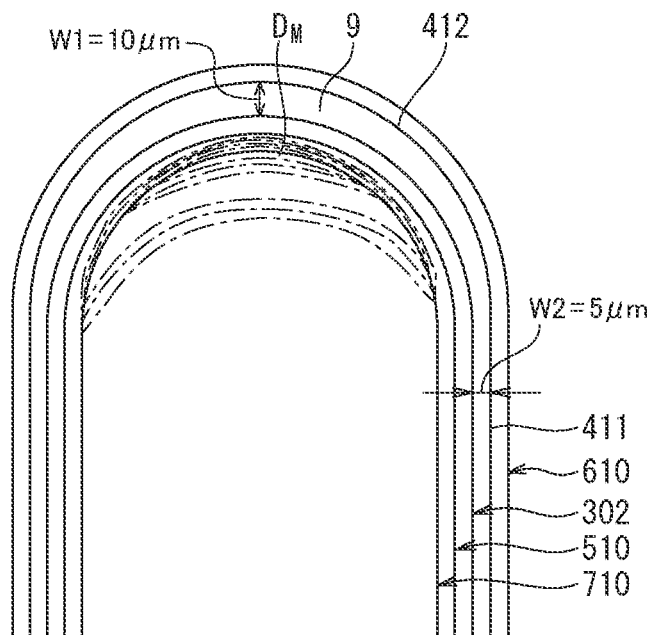
FIG. 12A is a schematic view illustrating the current density distribution in the case of W2=5 μm and W1=10 μm obtained in a simulation.
Figure 12B:
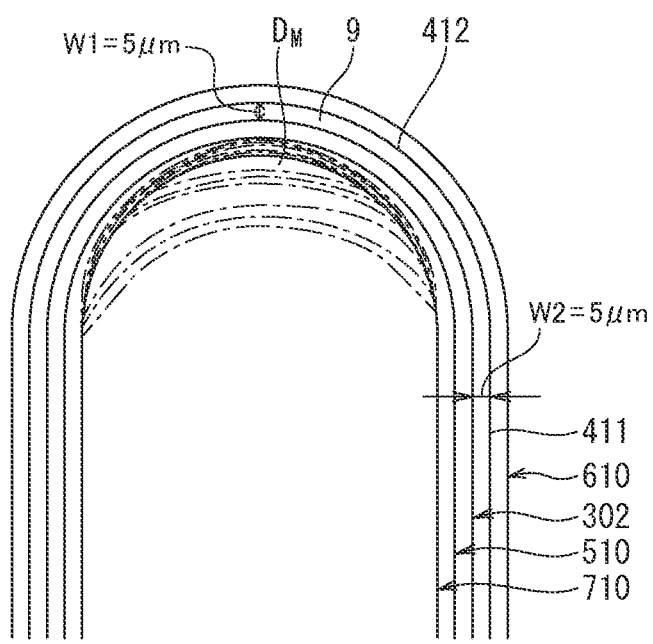
FIG. 12B is a schematic view illustrating the current density distribution in the case of W2=5 μm and W1=5 μm obtained in a simulation.

In FIG. 12A and FIG. 12B, a portion where the current density is less than 350 A/cm$^2$ is lightly shaded, a portion where the current density is 408.5 A/cm$^2$ or more is deeply shaded and designated by $D_M$, and portions with the same current density are illustrated by the alternate long and short dash lines between the portions. A comparison between FIG. 12A and FIG. 12B shows that, in the case of W2=5 μm, the current density concentration at the tip of the convex-shaped tip portion can be eased in the case of W1=10 μm as compared with the case of W1=5 μm.

Moreover, when the nitride semiconductor light emitting device 10 of the embodiment was investigated for the relationship between W3 and the maximum current density in the case of W4=5 μm, the relationship illustrated in FIG. 13 was obtained. This result shows that, in the range of W3≤20 μm, the current concentration can be further eased with an increase in "W3–W4" but, in the range of W3≥50 μm, the current concentration relaxation effect decreases. It is considered that, in the case of W3≥50 μm, the peripheral length of a portion equivalent to the "base portion" of the first electrode decreases, and therefore the entire current density increases.

[Ultraviolet Light Emitting Module]

An ultraviolet light emitting module of one aspect of the present invention has the nitride semiconductor light emitting device of one aspect of the present invention.

The ultraviolet light emitting module of one aspect of the present invention is applicable to and replaceable with all the existing devices containing an ultraviolet-ray lamp. In particular, the ultraviolet light emitting module of one aspect of the present invention is applicable to devices employing deep ultraviolet rays with a wavelength of 280 nm or less.

The semiconductor device and ultraviolet light emitting module of one aspect of the present invention are applicable to devices in the medical and life science field, the environmental field, the industry and industrial field, the life and household electrical appliance field, the agricultural field, and the other fields, for example. The nitride semiconductor light emitting device of one aspect of the present invention is applicable to synthesis and decomposition devices of medicines or chemical substances, liquid, gas, and solid (containers, foods, medical instruments, and the like) sterilization devices, cleaning devices for semiconductors and the like, surface modification devices for film, glass, metal, and the like, exposure devices for producing semiconductors, FPDs, PCBs, and the other electronic articles, printing and coating devices, bonding and sealing devices, transfer and molding devices for films, patterns, mock-ups, and the like, and measurement and inspection devices for bills, flaws, blood, chemical substances, and the like.

Examples of the liquid sterilization devices include, but are not limited thereto, water supply tanks for automatic ice making devices and ice trays and ice storage containers and ice making machines in refrigerators, cold water tanks, hot water tanks, and flow passage piping of freezers, ice making machines, humidifiers, dehumidifiers, and water servers, stationary water purifiers, portable water purifiers, water suppliers, hot water suppliers, waste water treatment devices, disposers, drainage traps of toilet bowls, washing machines, water sterilization modules for dialysis, connector sterilizers for peritoneal dialysis, water storage systems for disasters, and the like.

Examples of the gas sterilization devices include, but are not limited thereto, air purifiers, air-conditioners, ceiling fans, cleaners for floors and bedding, futon dryers, shoe dryers, washing machines, clothes dryers, indoor germicidal lamps, ventilation systems of storage warehouses, shoeboxes, wardrobes, and the like. Examples of the solid sterilization devices (including surface sterilization devices) include, but are not limited thereto, vacuum packing devices, belt conveyors, hand tool sterilization devices for medical use, dental use, barber shops, and beauty parlors, toothbrushes, toothbrush containers, chopstick cases, vanity bags, drain lids, private part washers of toilet bowls, toilet bowl lids, and the like.

DESCRIPTION OF REFERENCE NUMERALS 10 nitride semiconductor light emitting device
1 substrate
11 one surface of substrate (surface on which first nitride semiconductor layer is formed)
2 n-type nitride semiconductor layer (first nitride semiconductor layer)
21 surface parallel to one surface of substrate
20 nitride semiconductor laminate
3 mesa portion
30 side surface of mesa portion
31 n-type nitride semiconductor layer
32 nitride semiconductor light emitting layer
33 composition gradient layer
34 p-type nitride semiconductor layer (second nitride semiconductor layer)
301 visible outline of upper surface of mesa portion
302 visible outline of lower surface of mesa portion
351a, 352a straight portion (base portion) of mesa portion
351b, 352b convex-shaped tip portion of mesa portion
36a corner portion (convex-shaped tip portion) of mesa portion
36b straight portion (base portion) of mesa portion
4 n-type electrode layer (first electrode layer)
4A n-type electrode layer (first electrode layer)
4B n-type electrode layer (first electrode layer)
41a convex-shaped tip portion of n-type electrode layer
41b straight portion (base portion) of n-type electrode layer
410 visible outline of n-type electrode layer
45 n-type electrode layer (first electrode layer)
5 p-type electrode layer (second electrode layer)
51 straight portion (base portion) of p-type electrode layer
52 convex-shaped tip portion of p-type electrode layer
510 visible outline of p-type electrode layer
6 n-type pad electrode (first plate-shaped electrode)
61a convex-shaped tip portion of n-type pad electrode
61b straight portion (base portion) of n-type pad electrode
610 visible outline of n-type pad electrode
7 p-type pad electrode (second plate-shaped electrode)
71 straight portion (base portion) of p-type pad electrode
72 convex-shaped tip portion of p-type pad electrode
710 visible outline of p-type pad electrode
8 insulating layer
81 side surface insulating layer
9 gap between nitride semiconductor laminate and first electrode layer as in planar view.

What is claimed is:

1. A nitride semiconductor light emitting device comprising:
a substrate;
a nitride semiconductor laminate containing a first nitride semiconductor layer having a first conductivity type formed on the substrate, a nitride semiconductor light emitting layer formed on the first nitride semiconductor layer, and a second conductivity type second nitride semiconductor layer formed on the nitride semiconductor light emitting layer, the nitride semiconductor light emitting layer and the second nitride semiconductor layer being formed in one part on the first nitride semiconductor layer to configure a mesa portion, wherein a side surface of the mesa portion is defined by the second nitride semiconductor layer, the nitride semiconductor light emitting layer, and a portion of the first nitride semiconductor layer;
a first electrode layer formed on the first nitride semiconductor layer except the one part; and
a second electrode layer formed on the second nitride semiconductor layer, wherein
a planar shape of the mesa portion is a shape containing a convex-shaped tip portion formed by a curved line or a plurality of straight lines and a base portion continuous to the convex-shaped tip portion, the convex-shaped tip portion formed by the plurality of straight lines having an obtuse angle formed by adjacent two straight lines, and
an angle θ (≤90°) defined by a cross angle between the side surface of the mesa portion facing the first electrode layer and a surface parallel to a surface of the substrate on which the first nitride semiconductor layer is formed is smaller in the convex-shaped tip portion than in the base portion.

2. The nitride semiconductor light emitting device according to claim 1, comprising:
an insulating layer configured to prevent directly contacting the mesa portion and the second electrode layer with the first electrode layer, wherein
a thickness of the insulating layer formed on a side surface of the mesa portion facing the first electrode layer is larger in the convex-shaped tip portion than in the base portion.

3. The nitride semiconductor light emitting device according to claim 1, wherein
a planar shape of the second electrode layer is a shape containing a convex-shaped tip portion formed by a curved line or a plurality of straight lines and a base portion continuous to the convex-shaped tip portion, the convex-shaped tip portion formed by the plurality of straight lines having an obtuse angle formed by adjacent two straight lines,
a second plate-shaped electrode formed on the second electrode layer is provided, a visible outline of the second plate-shaped electrode is located inside a visible outline of the second electrode layer in planar view, and a relationship between W5 defined as an interval between the visible outline of the second plate-shaped electrode and the visible outline of the second electrode layer in the convex-shaped tip portion and W6 defined as an interval between the visible outline of the second plate-shaped electrode and the visible outline of the second electrode layer in the base portion is W5>W6.

4. The nitride semiconductor light emitting device according to claim 1, wherein the mesa portion defines, in planar view, two rod-like portions;

the first electrode layer includes a sandwiched portion sandwiched between the rod-like portions as in planar view, a planar shape of the sandwiched portion is a shape containing a convex-shaped tip portion formed by a curved line or a plurality of straight lines and a base portion continuous to the convex-shaped tip portion, the convex-shaped tip portion formed by the plurality of straight lines having an obtuse angle formed by adjacent two straight lines, a first plate-shaped electrode formed on the first electrode layer is provided, a visible outline of the first plate-shaped electrode is located inside a visible outline of the first electrode layer in the sandwiched portion in planar view, and a relationship between W7 defined as an interval between the visible outline of the first plate-shaped electrode and the visible outline of the first electrode layer in the convex-shaped tip portion and W8 defined as an interval between the visible outline of the first plate-shaped electrode and the visible outline of the first electrode layer in the base portion is W7>W8.

5. The nitride semiconductor light emitting device according to claim 1, wherein the nitride semiconductor laminate has an $Al_xGa_{(1-x)}N$ ($0 \leq x \leq 1$) composition gradient layer between the nitride semiconductor light emitting layer and the second nitride semiconductor layer, and a Ga concentration of the composition gradient layer increases toward a side of the second electrode layer from a side of the substrate.

* * * * *